US008269476B2

(12) United States Patent
Yabe et al.

(10) Patent No.: US 8,269,476 B2
(45) Date of Patent: Sep. 18, 2012

(54) LOAD CONTROLLER TO PULSE WIDTH MODULATION-CONTROL A LOAD

(75) Inventors: Hiroo Yabe, Susono (JP); Tsuyoshi Uchikura, Kosai (JP); Tatsumi Tashiro, Toyota (JP); Akihiro Tanaka, Toyota (JP); Masahiro Kasai, Toyota (JP)

(73) Assignees: Yazaki Corporation, Tokyo (JP); Toyota Jidosha Kabushiki Kaisha, Toyota-shi (JP)

( * ) Notice: Subject to any disclaimer, the term of this patent is extended or adjusted under 35 U.S.C. 154(b) by 173 days.

(21) Appl. No.: 12/332,478

(22) Filed: Dec. 11, 2008

(65) Prior Publication Data
US 2009/0153117 A1 Jun. 18, 2009

(30) Foreign Application Priority Data
Dec. 12, 2007 (JP) .................................. 2007-320547

(51) Int. Cl.
G05F 5/00 (2006.01)
H02M 3/155 (2006.01)
(52) U.S. Cl. ...................... 323/299; 323/351; 327/434
(58) Field of Classification Search .................. 323/299, 323/311, 351, 371, 282; 327/434, 581
See application file for complete search history.

(56) References Cited

U.S. PATENT DOCUMENTS

| 6,369,556 | B1 * | 4/2002 | Ohshima | 323/282 |
| 6,603,341 | B2 * | 8/2003 | Tuchiya et al. | 327/390 |
| 6,661,260 | B2 * | 12/2003 | Nakahara et al. | 327/109 |
| 7,046,073 | B2 * | 5/2006 | Mayama et al. | 327/434 |
| 7,848,073 | B2 * | 12/2010 | Takahashi | 361/93.2 |
| 7,919,995 | B2 | 4/2011 | Yabe et al. | |
| 2007/0241724 | A1 * | 10/2007 | Asada | 322/28 |
| 2009/0116161 | A1 * | 5/2009 | Takahashi et al. | 361/100 |
| 2009/0153235 | A1 | 6/2009 | Yabe et al. | |

FOREIGN PATENT DOCUMENTS
CA 2646258 A1 6/2009
(Continued)

OTHER PUBLICATIONS

English translation of JP 2001-148294. Retrieved from http://dossier1.ipdl.inpit.go.jp/AIPN/odse_top_dn.ipdl?N0000=7400 on Sep. 23, 2010.*
English translation of JP 2001-345684. Retrieved from http://dossier1.ipdl.inpit.go.jp/AIPN/odse_top_dn.ipdl?N0000=7400 on Sep. 23, 2010.*
English translation of JP 2007-159059. Retrieved from http://dossier1.ipdl.inpit.go.jp/AIPN/odse_top_dn.ipdl?N0000=7400 on Sep. 23, 2010.*

(Continued)

Primary Examiner — Adolf Berhane
Assistant Examiner — Fred E Finch, III
(74) Attorney, Agent, or Firm — Sughrue Mion, PLLC

(57) ABSTRACT

A load controller includes: an input circuit which detects that a drive instruction signal is less or equal to a first input threshold value; a constant current source activated in accordance with a detection by the input circuit; a PWM signal generating unit that is activated by the constant current source and generates a PWM signal; a comparator that is activated by the constant current source and compares the drive instruction signal with a second input threshold value set to be lower than the first input threshold value; a logic calculation unit that carries out a logic calculation of the PWM signal with a compared result of the comparator; a drive control unit that operates in accordance with an output from the logic calculation unit to generate a PWM drive control signal; and a load driving element that is driven by the PWM drive control signal to control a load.

7 Claims, 3 Drawing Sheets

FOREIGN PATENT DOCUMENTS

| | | |
|---|---|---|
| JP | 2001-148294 A | 5/2001 |
| JP | 2001-345684 A | 12/2001 |
| JP | 2004-248093 A | 9/2004 |
| JP | 2007-159059 A | 6/2007 |

OTHER PUBLICATIONS

Canadian Office Action issued on Sep. 15, 2011 in the corresponding Canadian Patent Application No. 2,646,524.

* cited by examiner

LOAD CONTROLLER TO PULSE WIDTH MODULATION-CONTROL A LOAD

BACKGROUND OF THE INVENTION

1. Technical Field

The present invention relates to a load controller, and more particularly to a load controller that PWM-controls a load.

2. Background Art

In vehicles, some of devices are required to operate in accordance with a drive instruction by the input of a control signal from an input switch even in a state that an ignition switch is turned off. In such devices, when the input switch is turned off, a current (dark current) needs to be lowered as much as possible, preferably to be set to zero from the viewpoint of a protection of a battery.

Thus, when a device is to be realized in which a PWM (Pulse Width Modulation) output operation is carried out by inputting a control signal (fixed input) under a state that an ignition switch is turned off, for instance, a load controller is found that is disclosed in JP-A-2001-148294. In this load controller, a load is PWM-controlled by a drive control signal whose frequency and duty ratio are set to a prescribed frequency and a prescribed duty ratio in accordance with a chopping wave generated by a chopping wave generating circuit.

Further, in a load controller disclosed in JP-A-2004-248093, current cut-off switching elements are added to all control parts for carrying out a drive control of load driving switching elements.

Further, in the load controller, when the dark current is zero during turning off an input, the accuracy of an operating threshold value voltage of an input part is deteriorated so that a malfunction is liable to occur due to noise or the like. Thus, as the input part of the load controller, such a structure as an input processing circuit disclosed in JP-A-2007-159059 is considered to be adopted. In this input processing circuit, a comparator having a hysteresis applied as input and output characteristics is arranged and a Schmitt circuit is connected to the input. The threshold value of the Schmitt circuit is set to be lower than that of the comparator to control the operation of the comparator by the output of the Schmitt circuit and remove a dark current in a stand-by state. Further, the hysteresis is applied to the comparator as the input and output characteristics to obtain a structure strong to noise. This structure is effective to a malfunction due to a leakage resistance component generated when an input switch is splashed with water or the like.

In a device disclosed in JP-A-2001-345684, a circuit example is shown that can reduce a dark current even when a gate leakage current of a MOSFET for driving a load is increased.

However, in the load controller disclosed in JP-A-2001-148294, even when the control input is turned off, an inner circuit always operates. Thus, a problem arises that a large amount of dark current is supplied.

Further, in the load controller disclosed in JP-A-2004-248093, when the current cut-off switching elements are added to all the control parts in a circuit, a dark current can be suppressed substantially to zero, however, a problem arises that the scale of the circuit is enlarged to enlarge the device.

Further, when the input processing circuit disclosed in JP-A-2007-159059 tries to be applied to the load controller, a problem arises that the dark current is suppressed only in the input part, but is supplied to other parts. Further, another problem arises that elements forming the circuit such as an inverter for enabling the Schmitt circuit or the comparator are increased to enlarge the scale of the circuit.

Further, in the load controller disclosed in JP-A-2001-345684, a charge pump is necessary so that the scale of the circuit is enlarged.

SUMMARY OF THE INVENTION

Thus, by considering the above-described problems, it is an object of the present invention to provide a load controller that can reduce a dark current when a load is driven and PWM-controlled by a drive instruction.

To solve the above-described problems, there is provided a load controller including: an input circuit which detects that a drive instruction signal by an operation of a drive instructing unit is less or equal to a first input threshold value; a constant current source activated in accordance with a detection by the input circuit; a PWM signal generating unit that is activated by the constant current source and generates a PWM signal having a prescribed frequency and a duty ratio; a comparator that is activated by the constant current source and compares the drive instruction signal with a second input threshold value set to be lower than the first input threshold value; a logic calculation unit that carries out a logic calculation of the PWM signal supplied from the PWM signal generating unit with a compared result supplied from the comparator; a drive control unit that operates in accordance with an output from the logic calculation unit to generate a PWM drive control signal; and a load driving element that is driven by the PWM drive control signal supplied from the drive control unit so as to PWM-control a load.

Preferably, the comparator is a comparator having a hysteresis so that when the drive instruction signal becomes less or equal to the second input threshold value, the second input threshold value becomes a level higher than a level at the time of activation, and when the drive instruction signal becomes more or equal to the second input threshold value at the high level, the second input threshold value returns to the level at the time of activation from the high level.

According to the above configuration, in a load controller that operates in response to the drive instruction signal of a low level (Lo) to drive a load, the first input threshold value is set by the input circuit having no hysteresis to detect the drive instruction signal. The constant current source is activated in accordance with the detected result. The comparator and the PWM signal generating unit are further activated by the activated constant current source. The PWM drive control signal is generated in accordance with the compared result of the second input threshold value set to be lower than the first input threshold value with the drive instruction signal by the comparator and the PWM signal supplied from the PWM signal generating unit. The load driving element is driven by the generated PWM drive control signal to PWM-control the load. Accordingly, when a drive instruction is not carried out, a dark current can be suppressed substantially zero, a determining accuracy of an input voltage can be improved at the same time. Further, since these structures are simpler than those of a usual device, the device can be made to be more compact and a cost can be lowered.

According to the above configuration, when the comparator having the hysteresis is used as the comparator, a highly accurate input determination that is strong to noise can be realized.

BRIEF DESCRIPTION OF THE DRAWINGS

The above objects and advantages of the present invention will become more apparent by describing in detail preferred exemplary embodiments thereof with reference to the accompanying drawings, wherein like reference numerals designate like or corresponding parts throughout the several views, and wherein.

DETAILED DESCRIPTION OF THE PREFERRED EMBODIMENTS

Figure 1:
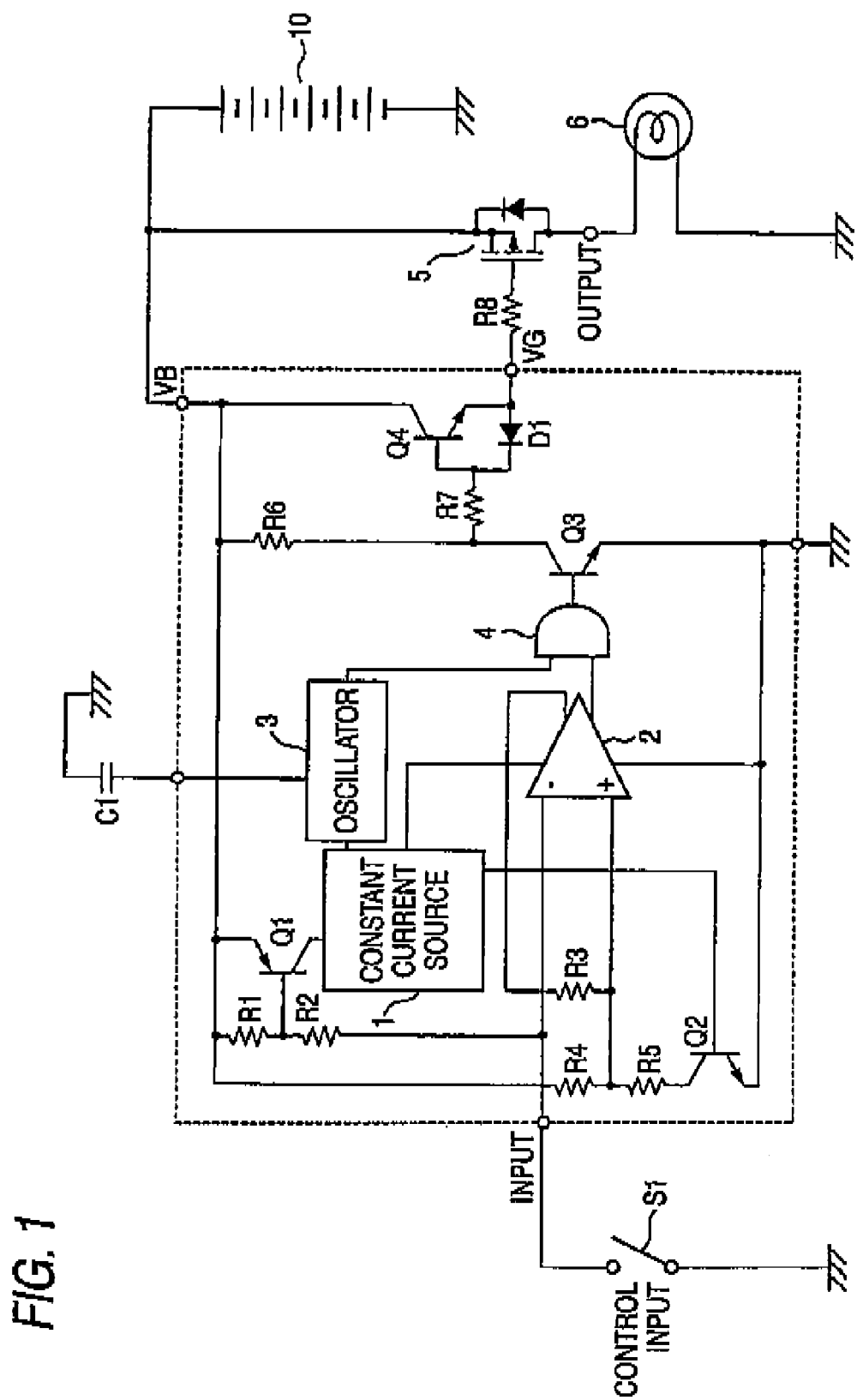
FIG. 1 is a circuit diagram showing a load controller according to an embodiment of the present invention.

Now, an embodiment of the present invention will be described below by referring to the drawings.

FIG. 1 is a circuit diagram showing an embodiment of a load controller according to the present invention. In this embodiment, a case will be described that a lamp (for instance, a head lamp, etc.) mounted on a vehicle as a load is PWM-controlled.

In FIG. 1, the load controller includes transistors Q1 to Q4, resistances R1 to R8, a capacitor C1, a diode D1, an input switch S1, a constant current source 1, a comparator 2, an oscillator 3, an AND gate 4, a P channel MOSFET (refer it to as a PMOSFET, hereinafter) 5, a lamp 6 mounted on a vehicle as a load and a battery 10.

As a switch element having no hysteresis, a pnp-typed transistor Q1 is provided and the constant current source 1 is driven by the pnp-typed transistor Q1. The resistance R1, the resistance R2 and the transistor Q1 form an input circuit in which a first input threshold value Vth is set. The emitter of the transistor Q1 and one side of the resistance R1 are connected to the battery 10 of a source voltage VB (for instance, 12 V). The other side of the resistance R1 is connected to the base of the transistor Q1 and one side of the resistance R2. The other side of the resistance R2 is connected to one side of the input switch S1 as a drive instructing unit and an inverting input terminal of the comparator 2. The other side of the input switch S1 is grounded. The collector of the transistor Q1 is connected to the constant current source 1. In the device disclosed in JP-A-2007-159059, the first input threshold value has the hysteresis, however, a hysteresis is not provided in the present invention, which is different from the above-described device.

Then, the comparator 2 and the oscillator 3 driven by the constant current source 1 and an npn-typed transistor Q2 as a switch element for providing a hysteresis are provided. The base of the transistor Q2 is connected to the constant current source 1, a collector thereof is connected to one side of the resistance R5 and an emitter thereof is grounded. The other side of the resistance R5 is connected to a non-inverting input terminal of the comparator 2, one side of the resistance R4 and one side of the resistance R3. The other side of the resistance R4 is connected to the battery 10. The other side of the resistance R3 is connected to an output terminal of the comparator 2.

The transistor Q2 and the resistances R3, R4 and R5 form a hysteresis applying unit for dividing the source voltage VB of the battery 10 to set a second input threshold value Vref. The second input threshold value Vref is set to be lower than the first input threshold value Vth.

The comparator 2 includes two fan outs. One of them is connected to the resistance R3 to function for applying the hysteresis. The other of them is connected to one input terminal of the AND gate 4 as a logic calculation unit of a gate output part.

The oscillator 3 serves as a PWM signal generating unit and an output thereof is connected to the other input terminal of the AND gate 4. As the oscillator 3, an oscillator the same as that disclosed in JP-A-2001-148294 may be used, however, any of oscillators that generate a PWM signal of a prescribed frequency and a duty ratio may be used without a special limitation. To the oscillator 3, the capacitor C1 for setting the prescribed frequency and the duty ratio is connected.

The gate output part includes the AND gate 4 as the logic calculation unit, and the resistances R6, R7, npn-typed transistors Q3 and Q4 and the diode D1 formed as a drive control unit. The AND gate 4 outputs the AND logic of the output of the comparator 2 and the output of the oscillator 3. The base of the transistor Q3 is connected to the output terminal of the AND gate 4, a collector thereof is connected to one side of the resistance R6 and one side of the resistance R7, and an emitter thereof is grounded. The other side of the resistance R6 is connected to the battery 10. The other side of the resistance R7 is connected to the base of the transistor Q4 and a cathode of the diode D1. An anode of the diode D1 is connected to the emitter of the transistor Q4. The collector of the transistor Q4 is connected to the battery 10.

An output part includes the resistance R8 and the P channel MOSFET (refer it to as a PMOSFET, hereinafter) 5 as a load driving element. The gate of the PMOSFET 5 is connected to the emitter of the transistor Q4 and the anode of the diode D1 through the resistance R8. The source of the PMOSFET 5 is connected to the battery 10, and a drain thereof is connected to one side of the lamp 6 mounted on a vehicle. The other side of the lamp 6 mounted on a vehicle is grounded. The cut-off voltage of the PMOSFET 5 is set to be sufficiently lower than a forward voltage drop Vbe4 between the base and the emitter of the transistor Q4 (since Vbe4 is about −0.7 V, the cut-off voltage is set to a value lower than −0.7 V, for instance, −1.5 V).

Figure 2:
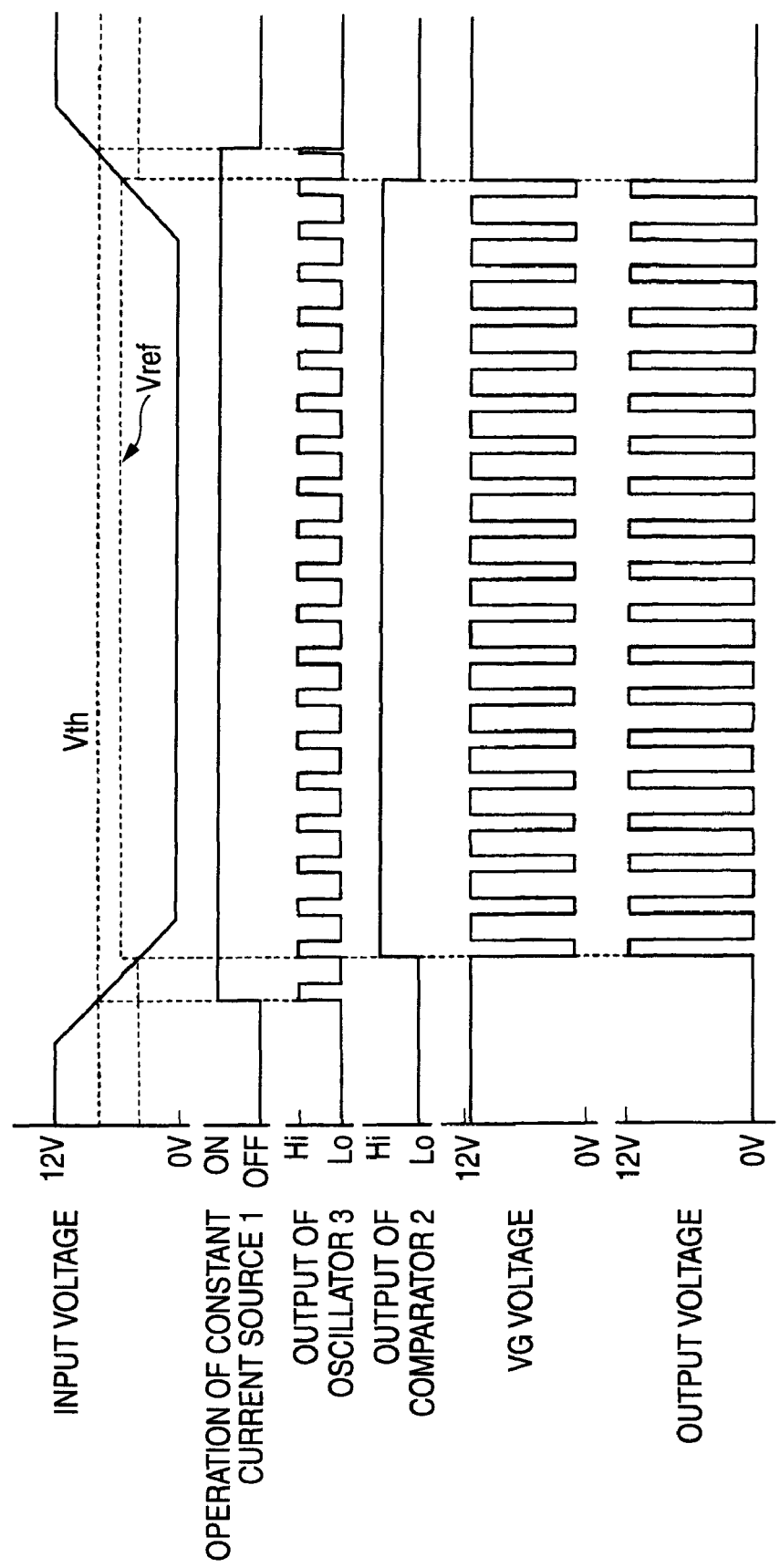
FIG. 2 is a timing chart of signals of respective parts in the load controller shown in FIG. 1.

Now, an operation of the load controller shown in FIG. 1 will be described below by referring to a timing chart of signals of respective parts shown in FIG. 2.

When the input switch S1 is turned off and an input voltage (a drive instruction signal) is the source voltage VB higher than the first input threshold value Vth of the input circuit, the transistor Q1 is turned off, the constant current source 1 is stopped and a dark current is not supplied. Assuming that a forward voltage between the base and the emitter of the transistor Q1 is Vbe, the first input threshold value Vth is given by a below-described equation (1). However, since Vbe changes owing to temperature and is affected by the current amplification factor of the transistor Q1 in addition thereto, the unevenness of Vbe is large.

$$Vth = VB - Vbe*(R1+R2)/R1 \qquad (1)$$

Then, when the input switch S1 is turned on and an input is grounded so that the input voltage falls to be lower than the first input threshold value Vth, the transistor Q1 is turned on and the constant current source 1 starts an operation to supply a constant current to parts respectively. Thus, the oscillator 3 is activated to start an oscillating operation. Further, the comparator 2 is also activated by the constant current source 1 and the transistor Q2 is turned on to input the second input threshold value Vref to the non-inverting input terminal of the comparator 2. The comparator carries out a comparing operation of the input.

During the activation of the comparator 2 by turning on the input switch S1, while the input voltage is higher than the second input threshold value Vref, the output of the comparator 2 is in a low (Lo) level. Thus, even when the output of the oscillator 3 becomes a high (Hi) level, the output of AND gate 4 of the gate output part is low, so that the base of the transistor Q3 remains low.

When the base of the transistor Q3 is low, the transistor Q3 is turned off. Thus, a current is supplied to the base of the transistor Q4 through the resistances R6 and R7 to activate the transistor Q4, so that the gate voltage VG of the PMOSFET 5 is raised to −0.7 V. Accordingly, the PMOSFET is turned off. At this time, when the PMOSFET 5 is normal and there is no leakage in the gate, the current supplied through the base of the transistor Q4 from the resistances R6 and R7 is zero. Thus, a dark current is not generated in the output part.

When the leakage is generated in the gate of the PMOSFET 5, the transistor Q4 is activated by the current supplied through the base of the transistor Q4 from the resistances R6 and R7 to maintain the gate voltage VG of the PMOSFET 5 to about −0.7 V as a cut-off voltage or higher, so that the PMOSFET 5 is not electrically conducted and the dark current is not generated.

Then, when the base of the transistor Q3 is high, the collector voltage of the transistor Q3 becomes substantially 0 V, so that the gate voltage VG of the PMOSFET 5 is lowered to the cut-off voltage or lower through the resistance R8, the diode D1 and the resistance R7. Thus, the PMOSFET 5 is turned on.

When the input switch S1 is turned on so that the input voltage further falls from the first input threshold value to be lower than the second input threshold value Vref, the output of the comparator 2 becomes a high level. Accordingly, when a PWM signal of the output of the oscillator 3 is high, the output of the AND gate 4 is also high to turn on the transistor Q3. Thus, a PWM drive control signal (VG voltage of FIG. 2) is supplied to the gate of the PMOSFET 5, and accordingly, the PMOSFET 5 is controlled to be turned on/off. Therefore, as shown in FIG. 2, the output voltage of the PMOSFET 5 has a PWM wave form, so that the lamp 6 mounted on a vehicle is PWM controlled to be turned on.

Assuming that a combined resistance of the resistance R3 and the resistance R5 is Rl, the second input threshold value Vref obtained when the output of the comparator 2 is low (that is, during the activation of the comparator 2) is Vref-l as a level during an activation expressed by a below-described equation (2).

$$V\text{ref-}l = Vb * Rl/(R4+Rl) \quad (2)$$

Assuming that a combined resistance of the resistance R3 and the resistance R4 is Rh, the second input threshold value Vref obtained when the output of the comparator 2 is high becomes a level Vref-h expressed by a below-described equation (3), which is higher than the level Vref-l during the activation.

$$V\text{ref-}h = Vb * R5/(Rh+R5). \quad (3)$$

Since both Vref-l and Vref-h are determined only by the ratio of the resistances, the unevenness of the input voltage can be reduced by such a contrivance as to use the resistances produced in the same production process and a determining accuracy of the input voltage can be improved. Further, while the lamp 6 mounted on a vehicle is turned on, since the second input threshold value Vref in the comparator 2 is Vref-h higher than the level Vref-l during the activation, the erroneous determination of the input voltage due to noise can be eliminated, the lamp 6 mounted on a vehicle that is turned on is not turned off owing to the influence of the noise so that a safety is improved.

Then, when the input switch S1 is operated to change a turning on state to a turning off state, the input voltage rises from a state that the input voltage is lower than Vref-h and exceeds the second input threshold value that is the high level Vref-h, the output of the comparator 2 is inverted from a high level to a low level to turn off the PMOSFET 5. Further, the second input threshold value Vref returns to the level Vref-l during the activation from the high level Vref-h.

Then, when the input voltage exceeds the high level Vref-h and further rises to be higher than the first input threshold value Vth, the transistor Q1 is turned off, so that the constant current source 1 is stopped. Thus, the comparator 2 and the oscillator 3 are also stopped to turn off the lamp 6 mounted on a vehicle and suppress the dark current substantially to zero.

Figure 3:
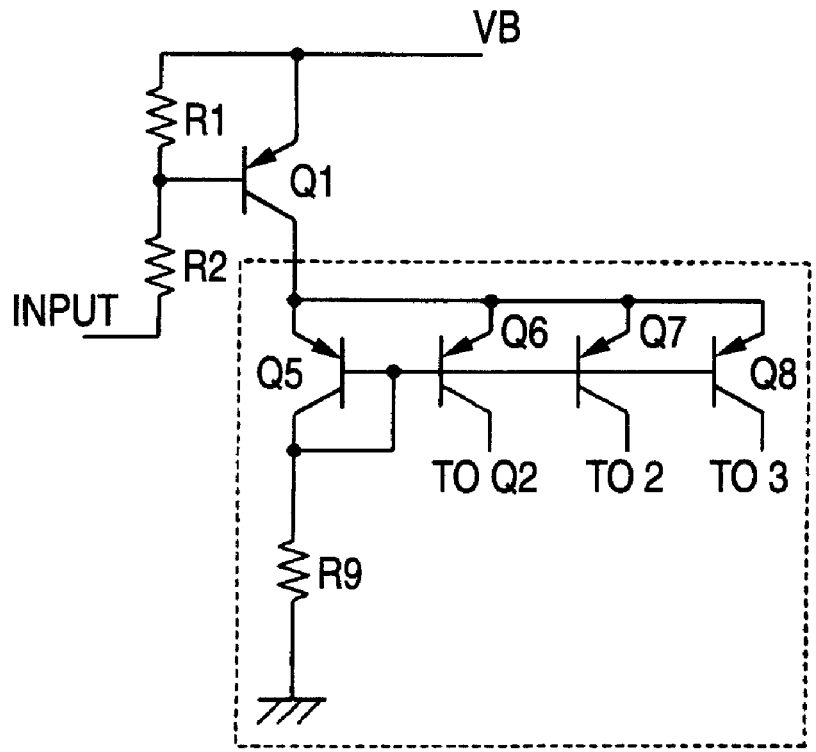
FIG. 3 is a circuit diagram showing a specific circuit example 1 of an input circuit and a constant current source 1 shown in FIG. 1.

FIG. 3 is a circuit diagram showing a specific circuit example 1 of the input circuit and the constant current source 1. In FIG. 3, a current mirror is formed by a resistance R9 and pnp-typed transistors Q5 to Q8.

Figure 4:
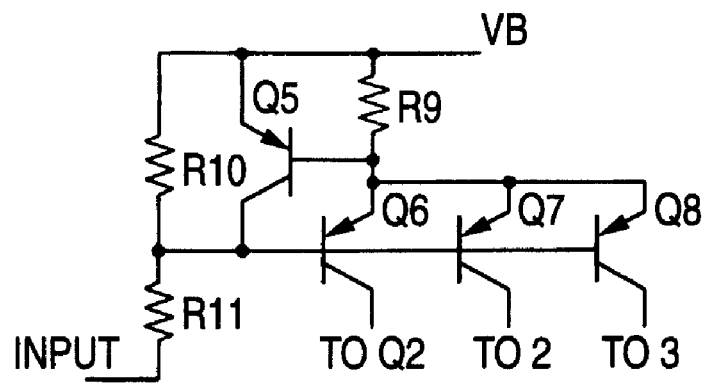
FIG. 4 is a circuit diagram showing a specific circuit example 2 of the input circuit and the constant current source shown in FIG. 1.

FIG. 4 is a circuit diagram showing a specific circuit example 2 of the input circuit and the constant current source 1. In FIG. 4, a current mirror is formed by resistances R9 to R11 and pnp-typed transistors Q5 to Q8. The resistances R10 and R11 and the transistor Q6 also serve as the input circuit. A first input threshold value Vth in this case is substantially given by a below-described equation (4).

$$Vth = VB - 2*Vbe*(R10+R11)/R10 \quad (4)$$

As described above, according to the present invention, in the device that operates by a low (Lo) input and outputs a PWM pulse by inputting a drive instruction signal (a fixed input), the first input threshold value is set by a combination of the input circuit having no hysteresis and the constant current source 1. A hysteresis is applied to the second input threshold value by the comparator 2 driven by the constant current source 1 and the hysteresis applying unit to decide the input voltage. The second input threshold value is set to be lower than the first input threshold value. Accordingly, the dark current at the time of turning off an ignition switch can be suppressed substantially to zero and the determining accuracy of the input voltage can be improved at the same time. Further, since the structures thereof are simpler than those of a usual device, the device can be made to be more compact and a cost can be reduced.

Further, to the load driving element, the PMOSFET 5 whose cut-off voltage is set to be lower than Vbe of the transistor is applied. In the gate drive and output part of the PMOSFET 5, an emitter follower by the transistor Q4, as bias by the resistances R6 and R7 and a gate current absorbing function by the diode D1 are provided. Accordingly, a simple structure can be realized in which a dark current during a normal time can be suppressed substantially to zero, and even when a leakage is generated in the gate of the PMOSFET 5, the PMOSFET 5 can be prevented from being electrically conducted to increase the dark current. Thus, the device can be made to be compact and the cost can be lowered.

As described above, the embodiment of the present invention is explained, however, the present invention is not limited thereto and various changes and applications can be made.

For instance, in the above-described embodiment, the fan outs of the comparator 2 may be reduced to one, and the resistance R3 may be deleted so that a structure having no hysteresis may be adopted.

Further, in the above-described embodiment, a part of a circuit enclosed by a dotted line may be formed with an IC (Integrated Circuit).

What is claimed is:

1. A load controller, comprising:
an input circuit which detects that a drive instruction signal by an operation of a drive instructing unit is less than or equal to a first input threshold value;
a constant current source activated in accordance with a detection by the input circuit;
a PWM signal generating unit that is activated by the constant current source and generates a PWM signal having a prescribed frequency and a duty ratio;
a comparator that is activated by the constant current source and compares the drive instruction signal with a second input threshold value set to be lower than the first input threshold value;
a logic calculation unit that carries out a logic calculation of the PWM signal supplied from the PWM signal generating unit with a compared result supplied from the comparator;
a drive control unit that operates in accordance with an output from the logic calculation unit to generate a PWM drive control signal;
a load driving element that is driven by the PWM drive control signal supplied from the drive control unit so as to PWM-control a load; and
a hysteresis applying unit which applies a hysteresis to the comparator in accordance with the activation of the constant current source,
wherein the input circuit is an input circuit without hysteresis, and
wherein the comparator is a comparator having the hysteresis so that when the drive instruction signal becomes less than or equal to the second input threshold value, the second input threshold value becomes a level higher than a level at the time of activation, and when the drive instruction signal becomes more than or equal to the second input threshold value at the high level, the second input threshold value returns to the level at the time of activation from the high level.

2. The load controller according to claim 1, wherein the hysteresis applying unit comprises a transistor, a base of which is connected to the constant current source so that the hysteresis applying unit applies the hysteresis in accordance with the activation of the constant current source.

3. The load controller according to claim 2, wherein the transistor is turned on to apply, by the hysteresis applying unit, the hysteresis to the comparator.

4. The load controller according to claim 1, wherein the hysteresis applying unit, the PWM signal generating unit, and the comparator are connected in parallel to the constant current source.

5. The load controller according to claim 1, wherein the hysteresis applying unit and the comparator are connected in parallel to the constant current source.

6. The load controller according to claim 1, further comprising a power source supplying a source voltage to the hysteresis applying unit.

7. The load controller according to claim 1, wherein the hysteresis applying unit divides the source voltage to set the second input threshold value.

* * * * *